Jan. 27, 1959 J. R. GOODYKOONTZ, JR 2,870,728

THREE DIMENSIONAL ALIGNING APPARATUS FOR ELECTRONIC COMPONENTS

Filed Nov. 29, 1957 2 Sheets-Sheet 1

JAMES R. GOODYKOONTZ, JR., INVENTOR

BY Donald L. Ryan

AGENT

JAMES R. GOODYKOONTZ, JR.,
INVENTOR
BY Donald L. Ryan
AGENT

United States Patent Office
2,870,728
Patented Jan. 27, 1959

2,870,728

THREE DIMENSIONAL ALIGNING APPARATUS FOR ELECTRONIC COMPONENTS

James R. Goodykoontz, Jr., Santa Monica, Calif., assignor to Hughes Aircraft Company, Culver City, Calif., a corporation of Delaware Application November 29, 1957, Serial No. 699,606

6 Claims. (Cl. 113—99)

The present invention relates generally to a production assembly apparatus for electronic modules and relates more particularly to an apparatus for three dimensionally precisely aligning leads of axial leaded electrical or electronic components and for retaining such components in position, thus to enable disposition of printed circuit boards on ends of the component leads.

With the advent of increased usage of electronic devices and requirements to place such devices, together with interconnecting wiring, in as small a space as possible, there has been developed a module form that is known as either a sandwich type construction or a cordwood arrangement, the former term being descriptive of the fact that components are disposed between a pair of spaced parallel boards having printed circuits carried thereon, with the latter term being descriptive of the positions of the components between the parallel boards. The chief advantage of this particular package configuration is in the high component density which it permits, as compared to that of a conventional flat printed wiring assembly wherein components lie flat against the board and wherein component leads are bent and inserted in suitable openings. Thus, with a packaging arrangement of the present type, an increase in efficiency may be obtained and, due to the use of a multiplicity of components as structural members of the assembly, a high degree of strength and rigidity is attained without reliance upon brackets or other excess parts.

While the sandwich or cordwood type of assembly package for electronic circuits presents many advantages, serious difficulties have been experienced heretofore in connection with assembly of components in a manner to enable use of this package in high production manufacture thereof. The basic problem in connection with such an assembly of this sandwich or cordwood module has been that of aligning all electrical or electronic component leads with sufficient accuracy as to enable disposition of a printed circuit board thereon and free passage of all of such leads through openings in the board. This problem of assembly is further complicated due to the fact that the components employed are in most instances relatively small with an average module containing between 50 and 100 components that are arranged in a space approximately ¾" square and 4" long.

A still greater advantage is seen in the use of the sandwich or cordwood electronic module assembly package in connection with contemporary requirements for repetitive circuits as may be employed in electronic computers and like apparatus. In such apparatus only a few different types of modules are required, a complete unit containing a large number of each individual type of module. These modules may be provided with connector pins in order that they may be plugged in to a master board in such a manner as to be easily removed for repair or replacement. It may thus be seen that the amount of wiring, the size and weight of chassis and supporting brackets or the like, are reduced to a bare minimum commensurate with a rigid structure having superior vibration resistant characteristics and other improved factors as discussed hereinbefore.

While apparatus has now been developed to provide automatic assembly of sandwich or cordwood type circuit modules, it is frequently necessary to assemble one or more low production modules or to assemble a few such modules for test purposes. In such instances it is most practical to assemble such low production circuit modules by hand rather than with automatic machinery. In order to accomplish such hand assembly of these modules, the present apparatus is provided.

Generally, the device hereof includes a double row of spaced vertically disposed pins and a plurality of individually movable horizontally disposed rods, thus to define generally square spaces between the pins and the rods, in which axial leaded components are disposed. Following such disposition of the components, the unit carrying the pins and bars is disposed at an angle thereby three dimensionally precisely locating the leads of the components. Thereafter, a pair of printed circuit boards, having a plurality of openings, are disposed with the component leads extending through the openings, such leads thereafter being secured in place as by soldering.

It is accordingly one object of the present invention to provide a novel sandwich or cordwood type circuit module assembly apparatus.

It is another important object of the invention to provide an assembly apparatus for sandwich or cordwood type electrical circuit modules wherein means are provided precisely to locate component leads.

Another object of the invention is to provide a sandwich or cordwood type electrical circuit module assembly apparatus that is simple in construction, efficient in operation, reliable in use and which may be used by relatively inexperienced operators.

Other and further important objects of the invention will become apparent from the disclosures in the following detailed specification, appended claims and accompanying drawings, wherein:

Figure 2:
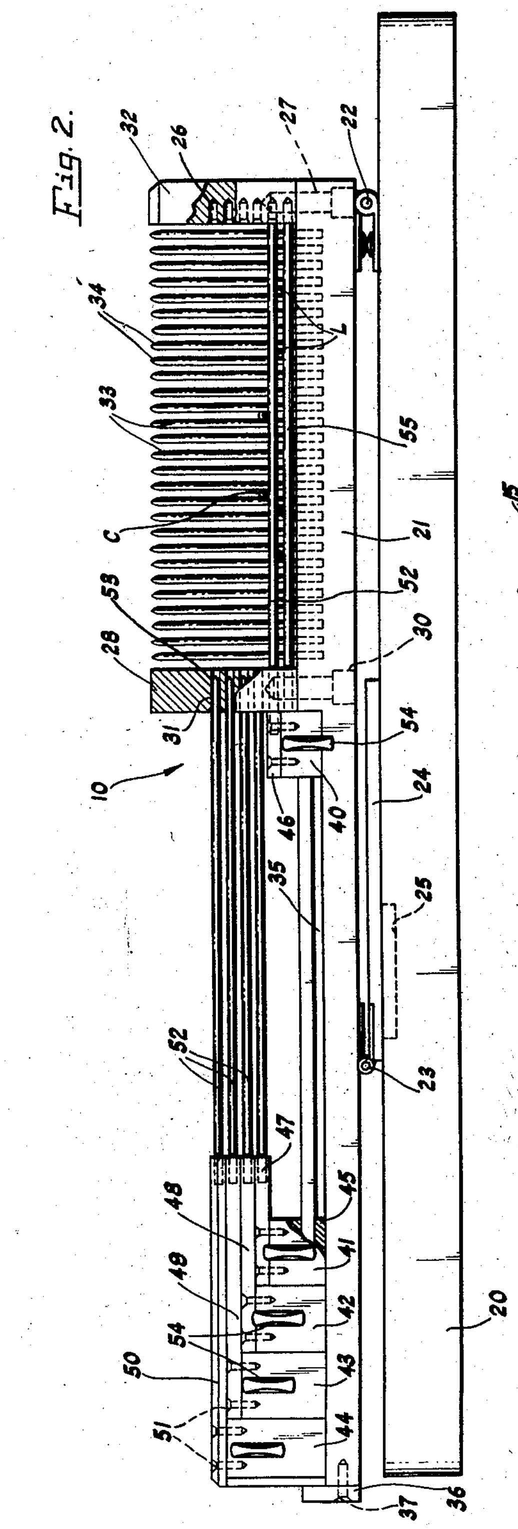
Fig. 2 is a side elevational view, partially in section, of the present circuit assembly apparatus.
Figure 6:
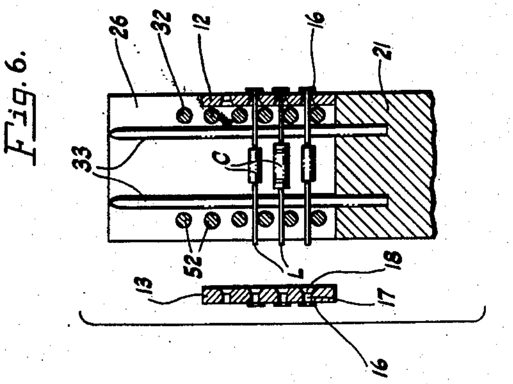
Figures 3, 4, 5:
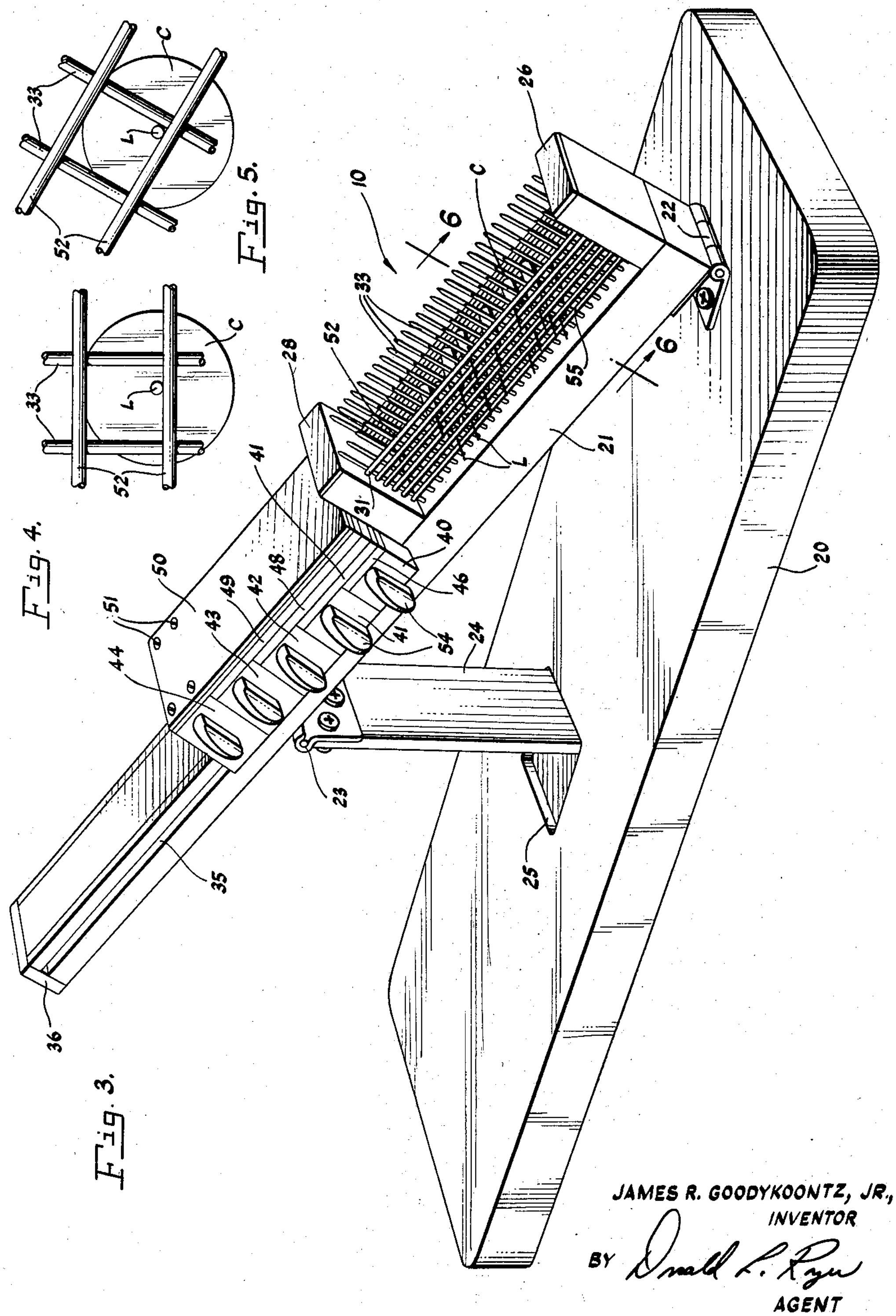
Fig. 3 is a perspective view showing the present circuit assembly apparatus in a different position.

Figs. 4 and 5 are enlarged fragmentary detail views showing the relationships between the vertical pins and horizontal rods in the two positions illustrated in Figs. 2 and 3 respectively; and Fig. 6 is an enlarged fragmentary sectional view taken substantially as indicated by line 6—6, Fig. 3, and illustrating a stage in the assembly of the present circuit module.

With reference to the drawings, the assembly apparatus of the present invention is shown as indicated generally at 10. This particular apparatus may be used for assembling a variety of different types and specific representations of sandwich or cordwood type electronic circuit modules, one example of such a module being shown in Fig. 1 and indicated generally at 11.

Figure 1:
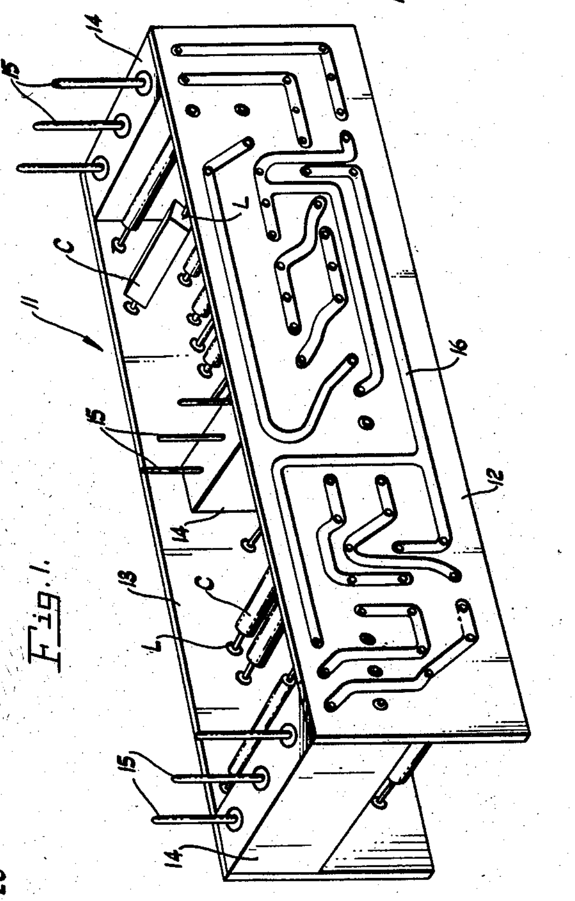
Figure 1 is a perspective view of an example of a typical completed sandwich or cordwood type of electronic circuit module.

With reference to Fig. 1, the completed example of the typical module 11 includes a pair of printed circuit boards 12 and 13 that are disposed in spaced parallel relationship and retained in this position by means of spacers 14. The spacers 14 may be of any desired type and may include connector pins 15, thus to provide means for plugging the present circuit module into a master chassis containing interconnecting circuitry. The circuit boards 12 and 13 are each provided with a printed circuit pattern 16 which, with reference to Fig. 6, have a plurality of openings 17 therethrough, these openings cooperating with the printed circuit pattern 16. The ends of the openings 17, remote from the surface of the boards carrying the printed circuit pattern 16, are conically contoured as at 18 for a purpose to be hereinafter more fully described. It is further to be noted that the module 11 includes a plurality of components C having axial leads L extending therefrom. The leads L are disposed through the openings 17 with outer ends thereof being secured to the printed circuit pattern 16 as by soldering.

With reference to the apparatus 10, this apparatus includes a planar base plate member 20, there being an elongated carriage 21 movably secured thereto as by a hinge 22. The hinge 22 is attached to one end of the carriage 21, a second hinge 23 being mounted on a lower side of the carriage 21 and carrying a leg member 24. The leg member 24 is adapted for cooperation with a rectangular recess 25 in an upper surface of the base member 20, whereby to provide means for selectively disposing the carriage 21 in a horizontal position, as shown in Fig. 2, or in an angular manner as shown in Fig. 3, for purposes to be hereinafter more fully described.

With reference to Fig. 2, a vertically disposed end member 26 is secured to one end of the carriage 21 as by bolts 27. The carriage 21 also supports a vertically disposed guide member 28 that is secured thereto by means of bolts 30. The guide member 28 is positioned in approximately a central longitudinal area of the carriage 21 and is provided with a pair of vertical rows of a plurality of horizontally disposed openings 31 which extend therethrough. Additionally, the end member 26 is provided with two rows of a plurality of horizontally extending, vertically spaced recesses 32.

As shown in Figs. 2 and 3, a plurality of vertically disposed, spaced pins 33 extend upwardly from an upper surface of the carriage 21. The pins 33 are disposed in suitable recesses in the carriage 21 and have upper ends that are pointed or contoured as at 34. The pins 33 are positioned in two spaced parallel rows between the end member 26 and the guide member 28, thus to divide the space therebetween into equal segments.

The carriage 21 has a pair of laterally disposed longitudinally extending grooves 35 along each edge thereof and extending from a point adjacent one side of the guide member 28 to an end thereof remote from the hinge 22. An end plate member 36 is secured to the one end of the carriage 21 and provides a terminal point for the grooves 35, the plate member 36 being secured in place by means of screws 37. The grooves 35 serve movably to support a plurality of slide members 40, 41, 42, 43 and 44, each of which have tongue portions 45 which extend inwardly and engage the grooves 35. The slide members 40 through 44 each serve to support plate members 46, 47, 48, 49 and 50 that are secured in position to each of the bars by means of screws 51. The plate members 46 through 50 all extend laterally from upper surfaces of the slide members 40 through 44 and terminate in a common plane at ends thereof, surfaces of the plates being adapted for slidable disposition in vertical contact with each other.

Longitudinal ends of each of the plate members 46 through 50 serve each to support a pair of laterally spaced rods 52 that are disposed in suitable recesses in the ends of the plates 46 through 50 and extend longitudinally therefrom for slidable disposition in the openings 31 of the guide member 28. Ends of the rods 52 are pointed or contoured as at 53 and are disposed to lie adjacent to and laterally outwardly from the rows of pins 33. Each of the slide members 40 through 44 are also provided with laterally extending, finger engageable handles 54 whereby to enable individual manual sliding movement of each of the slide members 40 through 44, together with their respective plates 46 through 50 and rods 52. As shown in Fig. 2, additional rods 55 are permanently disposed laterally outwardly from the pins 33 and extend between the end member 26 and the guide member 28 adjacent the upper surface of the carriage 21.

In use of the present assembly apparatus for electronic circuit modules, the slide members 40 through 44 are originally positioned at the leftward end of the carriage as viewed in Fig. 2. Thereafter, leads L of appropriate axial leaded components are disposed with the component positioned laterally between the spaced rows of pins 33 and the leads thereof extending between and laterally beyond the pins 33 and upon the rods 55. Thereafter, the slide 40 is moved to the position shown in Fig. 2, with the rods 52 thereof extending through the appropriate openings 31 in the guide member 28 and the ends 53 being disposed in a pair of the recesses 32 in the end member 26. Thereafter, other components are disposed between the spaced rows of pins 33 with the leads thereof resting upon the newly positioned rods 52. This procedure is repeated until all of the slide members 40 through 44 have been moved to a rightward position, as viewed in Fig. 2, and the desired number of appropriate components have been positioned in the square spaces defined between the pins 33 and rods 52.

Following complete disposition of all the desired components in the spaces provided between the pins 33 and rods 52, the carriage 21, together with all of the apparatus carried thereby is elevated to the position shown in Fig. 3 through use of the leg 24, hinge 23 and recess 25. As shown in Figs. 4 and 5, this angular disposition of the carriage 21 serves precisely to position the leads L with respect to the pins 33 and rods 52 by causing these leads to engage a junction between one of the pins 33 and one of the rods 52 in each of the rows of pins. It may be seen that this precise alignment thereafter enables free disposition of the circuit boards 12 and 13 on the laterally protruding leads L and precise alignment between these leads and the openings 17 between the circuit boards. This arrangement is shown in Fig. 6 wherein the board 12 is disposed in position and the board 13 is ready for such disposition, the conical end portions 18 of the openings 17 serving to permit ready insertion of the lead ends.

Following disposition of the boards 12 and 13 on the protruding ends of the leads L, the slide members 40 through 44 are again moved to their leftward position, as viewed in Fig. 2, whereby to retract the rods 52 and permit removal of the assembled module by grasping the boards 12 and 13 and vertical withdrawal of the component leads from between the pins 33.

To permanently secure the components in position, the leads L are next soldered to the printed pattern 16, it being appropriate to provide such soldering by dipping the entire circuit carrying surfaces of the boards 12 and 13 in a bath of molten solder that flows about the protruding leads and provides a tight bond between the circuit pattern 16 and the component leads. Excess ends of the leads are then removed, thus leaving the completely assembled circuit module of the typical type shown in Fig. 1. It is to be noted that no structural components other than the boards 12 and 13, spacers 14 and the components C, together with the leads thereof, are employed with the present type module and that the rigid nature of the completed structure is dependent upon the plurality of leads and the soldered association thereof with the printed circuit pattern 16.

It may thus be seen that many different types of circuit modules may be assembled with the present apparatus, it being only necessary to provide an operator with sufficient information as to instruct disposition of particular components between particular pairs of pins 33. To facilitate this selection, the pins 33 may be suitably identified as by coloring or numbering of the surface of the carriage 21 adjacent lower ends of the pins 33 or may be numbered to indicate the spaces between the various pins. Additionally, the rods 52 may also be color coded or numbered as desired. Thus, an inexperienced operator may assemble the desired circuit module through use of the present apparatus and without an understanding of the circuitry completed by the module or more than a mere general knowledge of electronic or electrical components.

Having thus described the invention and the present embodiment thereof, it is desired to emphasize the fact that many modifications may be resorted to in a manner limited only by a just interpretation of the following claims.

I claim:

1. An electronic circuit module component aligning apparatus comprising: a supporting structure normally adapted for horizontal disposition; spaced rows of pins disposed normally generally vertically from said supporting structure; a plurality of pairs of rods adapted for disposition adjacent and substantially normal to said rows of pins; means for individually selectively disposing at least a portion of said pairs of rods in said position adjacent said pins, whereby to define a plurality of laterally aligned pairs of generally square spaces between said rods and said pins through which leads of said components may be disposed; and means for effecting gravitational engagement of said leads with said pins and rods at laterally spaced junctions between one pair of said pins and one pair of said rods thus to align said leads to permit disposition of perforated circuit carrying boards thereon.

2. An electronic circuit module component aligning apparatus comprising: a supporting structure normally adapted for horizontal disposition; spaced rows of pins disposed normally generally vertically from said supporting structure; a plurality of pairs of rods adapted for disposition adjacent and substantially normal to said rows of pins; means for individually selectively disposing at least a portion of said pairs of rods in said position adjacent said pins, whereby to define a plurality of laterally aligned pairs of generally square spaces between said rods and said pins through which leads of said components may be disposed; and means for angularly disposing said supporting structure, said pins and said rods, whereby to effect gravitational engagement of said leads with said pins and rods at laterally spaced junctions between one pair of said pins and one pair of said rods thus to align said leads to permit disposition of perforated circuit carrying boards thereon.

3. An electronic circuit module component aligning apparatus comprising, in combination: a supporting structure normally adapted for horizontal disposition; spaced rows of pins disposed normally generally vertically from said supporting structure; a plurality of pairs of rods adapted for disposition adjacent and substantially normal to said rows of pins; means disposed for longitudinal sliding movement on said supporting structure for individually selectively disposing at least a portion of said pairs of rods in said position adjacent said pins, whereby to define a plurality of laterally aligned pairs of generally square spaces between said rods and said pins through which leads of said components may be disposed; and means for angularly disposing said supporting structure, said pins and said rods, whereby to effect gravitational engagement of said leads with said pins and rods at laterally spaced junctions between one pair of said pins and one pair of said rods thus to align said leads to permit disposition of perforated circuit carrying boards thereon.

4. An electronic circuit module component aligning apparatus comprising in combination: a base; a supporting carriage structure normally adapted for horizontal disposition; spaced rows of pins disposed normally generally vertically from said supporting carriage structure; slide members disposed for longitudinal sliding movement on said carriage structure; a plurality of rods carried in laterally spaced pairs by each of said slide members, said rods being adapted for disposition adjacent and substantially normal to said rows of pins, said rods being adapted for selective disposition in said position adjacent each row of said pins, whereby to define a plurality of laterally aligned pairs of generally square spaces between said rods and said pins through which leads of said components may be disposed; and means for angularly disposing said carriage structure, said pins and said rods, whereby to effect gravitational engagement of said leads with said pins and rods at laterally spaced junctions between one pair of said pins and one pair of said rods thus to align said leads to permit disposition of perforated circuit carrying boards thereon.

5. An electronic circuit module component aligning apparatus comprising, in combination: a base; a supporting carriage structure normally adapted for horizontal disposition and hingedly secured to said base; spaced rows of pins disposed normally generally vertically from said supporting carriage structure; slide members disposed for longitudinal sliding movement on said carriage structure; a plurality of rods carried in laterally spaced pairs by common ends of each of said slide members, said rods being adapted for disposition adjacent and substantially normal to said rows of pins; means for guiding said rods, said rods being adapted for selective disposition in said position adjacent each row of said pins, whereby to define a plurality of laterally aligned pairs of generally square spaces between said rods and said pins through which leads of said components may be disposed; and leg means for angularly disposing said carriage structure, said pins and said rods, whereby to effect gravitational engagement of said leads with said pins and rods at laterally spaced junctions between one pair of said pins and one pair of said rods thus to align said leads to permit disposition of perforated circuit carrying boards thereon.

6. An electronic circuit module component aligning apparatus comprising in combination: a base; a supporting carriage structure normally adapted for horizontal disposition and hingedly secured to said base; spaced rows of pins disposed normally generally vertically from said supporting carriage structure; slide members disposed for longitudinal sliding movement on said carriage structure; a plurality of rods carried in laterally spaced pairs by common ends of each of said slide members, said rods being adapted for disposition adjacent and substantially normal to said rows of pins; means for guiding said rods, said rods being adapted for selective disposition in said position adjacent each row of said pins, whereby to define a plurality of laterally aligned pairs of generally square spaces between said rods and said pins through which leads of said components may be disposed; and leg means carried by said carriage structure and cooperable with said base for angularly disposing said carriage structure, said pins and said rods, whereby to effect gravitational engagement of said leads with said pins and rods at laterally spaced junctions between one pair of said pins and one pair of said rods thus to align said leads to permit disposition of perforated circuit carrying boards thereon.

References Cited in the file of this patent

UNITED STATES PATENTS

| | | |
|---|---|---|
| 1,802,929 | Seelert | Apr. 28, 1931 |
| 2,699,133 | Ames et al. | Jan. 11, 1955 |